United States Patent
Trivedi

(10) Patent No.: US 7,081,398 B2
(45) Date of Patent: Jul. 25, 2006

(54) METHODS OF FORMING A CONDUCTIVE LINE

(75) Inventor: Jigish G. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 215 days.

(21) Appl. No.: 09/976,635

(22) Filed: Oct. 12, 2001

(65) Prior Publication Data

US 2003/0071356 A1    Apr. 17, 2003

(51) Int. Cl.
    *H01L 21/76* (2006.01)

(52) U.S. Cl. .................. 438/430; 438/435; 438/620; 438/668

(58) Field of Classification Search ................ 438/618, 438/426, 430, 435, 443, 444, 445, 446, 700, 438/668, 669, 620, 621, 361, 453, 197, 199, 438/223, 221, 637, 642; 257/774, 377, 382, 257/499, 501, 506, 508, 510, 509, 520

See application file for complete search history.

(56) References Cited

U.S. PATENT DOCUMENTS

| | | | | |
|---|---|---|---|---|
| 4,661,202 A | * | 4/1987 | Ochii | 438/621 |
| 5,573,969 A | * | 11/1996 | Kim | 438/224 |
| 5,614,765 A | | 3/1997 | Avanzino et al. | |
| 5,920,098 A | * | 7/1999 | Liaw | 257/383 |
| 5,970,375 A | | 10/1999 | Gardner et al. | |
| 6,008,084 A | | 12/1999 | Sung | |
| 6,011,712 A | | 1/2000 | Lee | 365/156 |
| 6,017,813 A | | 1/2000 | Kuo | |
| 6,027,994 A | * | 2/2000 | Huang et al. | 438/618 |
| 6,071,804 A | | 6/2000 | Gau | |
| 6,133,116 A | * | 10/2000 | Kim et al. | 438/430 |
| 6,180,494 B1 | | 1/2001 | Manning | 438/443 |
| 6,258,709 B1 | | 7/2001 | McDaniel | |
| 6,271,125 B1 | | 8/2001 | Yoo et al. | |
| 6,287,965 B1 | * | 9/2001 | Kang et al. | 438/648 |
| 6,337,274 B1 | | 1/2002 | Hu et al. | |
| 6,346,438 B1 | * | 2/2002 | Yagishita et al. | 438/197 |
| 6,350,679 B1 | | 2/2002 | McDaniel et al. | |
| 6,365,504 B1 | | 4/2002 | Chien et al. | |
| 6,376,380 B1 | | 4/2002 | Tang et al. | |
| 6,394,883 B1 | | 5/2002 | Carlson et al. | |
| 6,461,225 B1 | | 10/2002 | Misra et al. | 451/41 |
| 6,498,088 B1 | | 12/2002 | Trivedi | 438/618 |
| 6,720,269 B1 | | 4/2004 | Park et al. | |
| 6,724,054 B1 | | 4/2004 | Kang et al. | |
| 6,730,570 B1 | | 5/2004 | Shin et al. | |
| 2001/0003663 A1 | * | 6/2001 | Huang | 438/240 |
| 2002/0072224 A1 | | 6/2002 | Huang et al. | |

FOREIGN PATENT DOCUMENTS

EP         0457131       * 11/1991

OTHER PUBLICATIONS

Wolf et al ["Silicon Processing For the VLSI ERA", vol. 1 Process technology, pp. 5–6, Lattic Press 1986].*
U.S. Appl. No. 10/925,158, filed Aug. 2004, Southwick et al.

* cited by examiner

*Primary Examiner*—Chandra Chaudhari
(74) *Attorney, Agent, or Firm*—Wells St. John P.S.

(57) ABSTRACT

A method of forming a local interconnect includes forming an isolation trench within a semiconductor substrate. A first trench isolation material is deposited to within the trench. First isolation material is removed effective to form a line trench into a desired local interconnect. Conductive material is formed therewithin. A second isolation material is deposited over the first isolation material, over the conductive material within the isolation trench and within the line trench. At least some first and second isolation material is removed in at least one common removing step. Integrated circuitry includes a substrate comprising trench isolation material. A local interconnect line is received within a trench formed within the isolation material. The local interconnect includes at least two different conductive materials. One of the conductive materials lines the trench. Another of the conductive materials is received within a conductive trench formed by the one. Other implementations are disclosed.

39 Claims, 7 Drawing Sheets

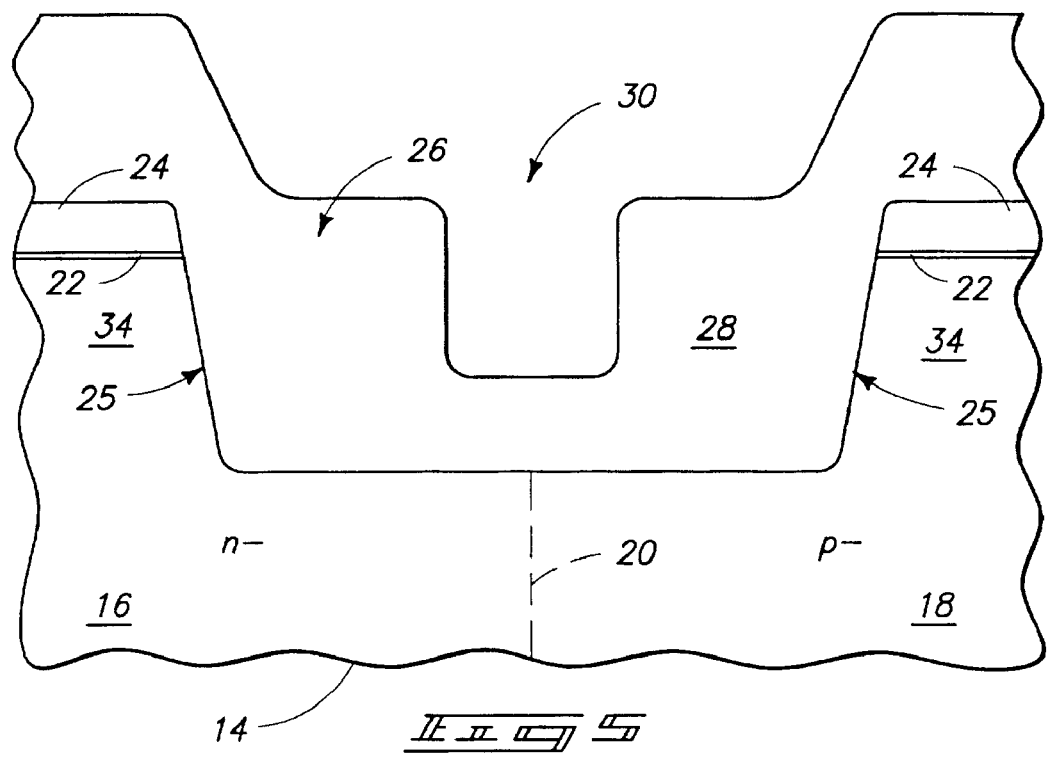
_Fig 5_
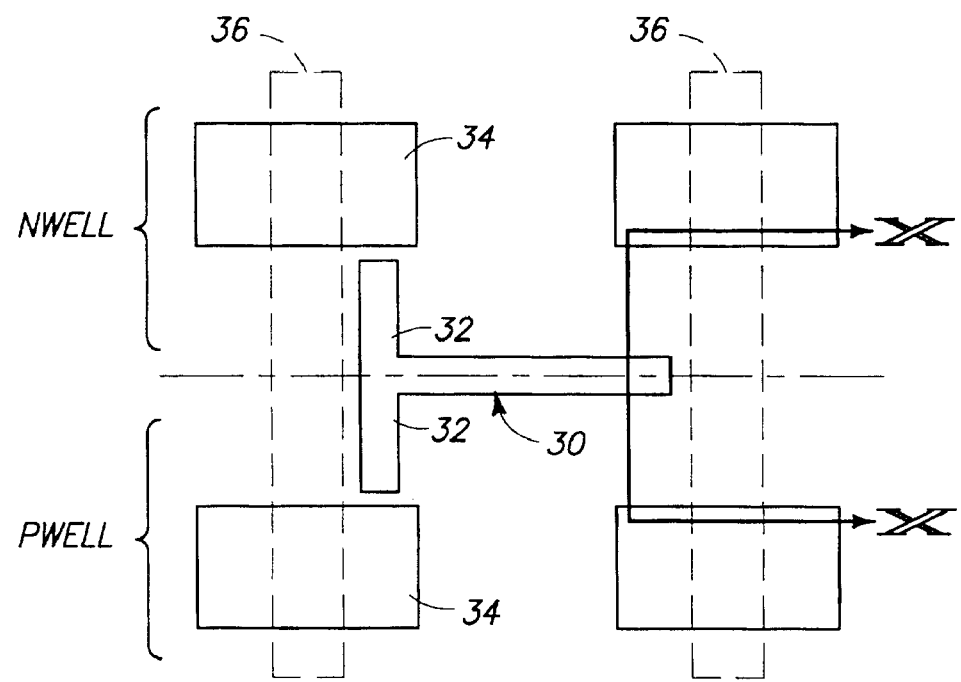
_Fig 6_

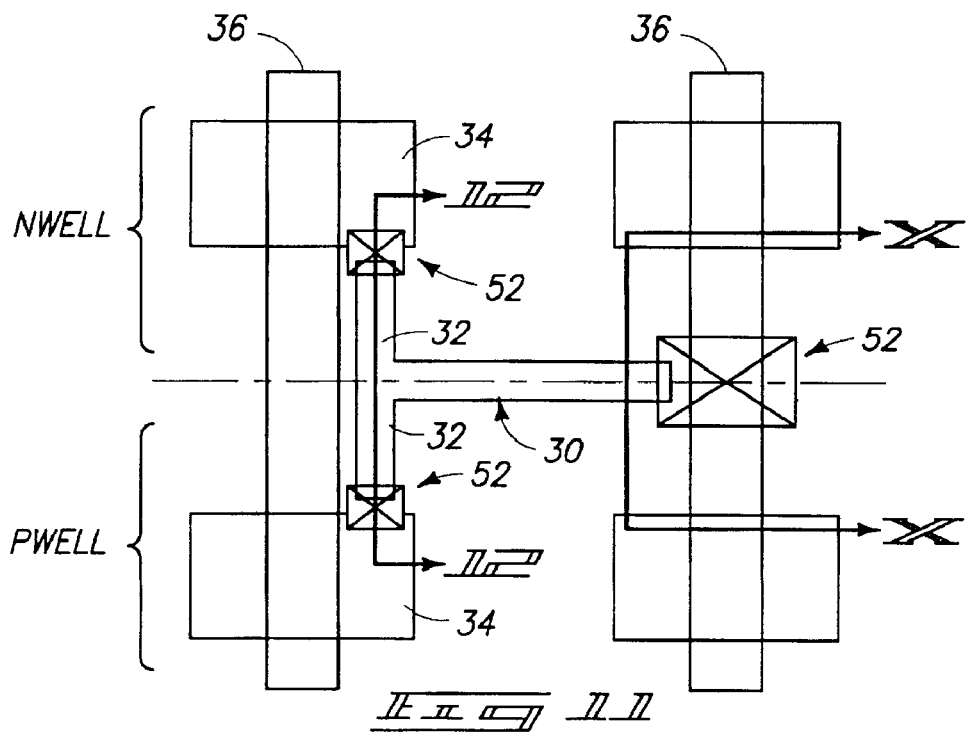
_FIG. 11_
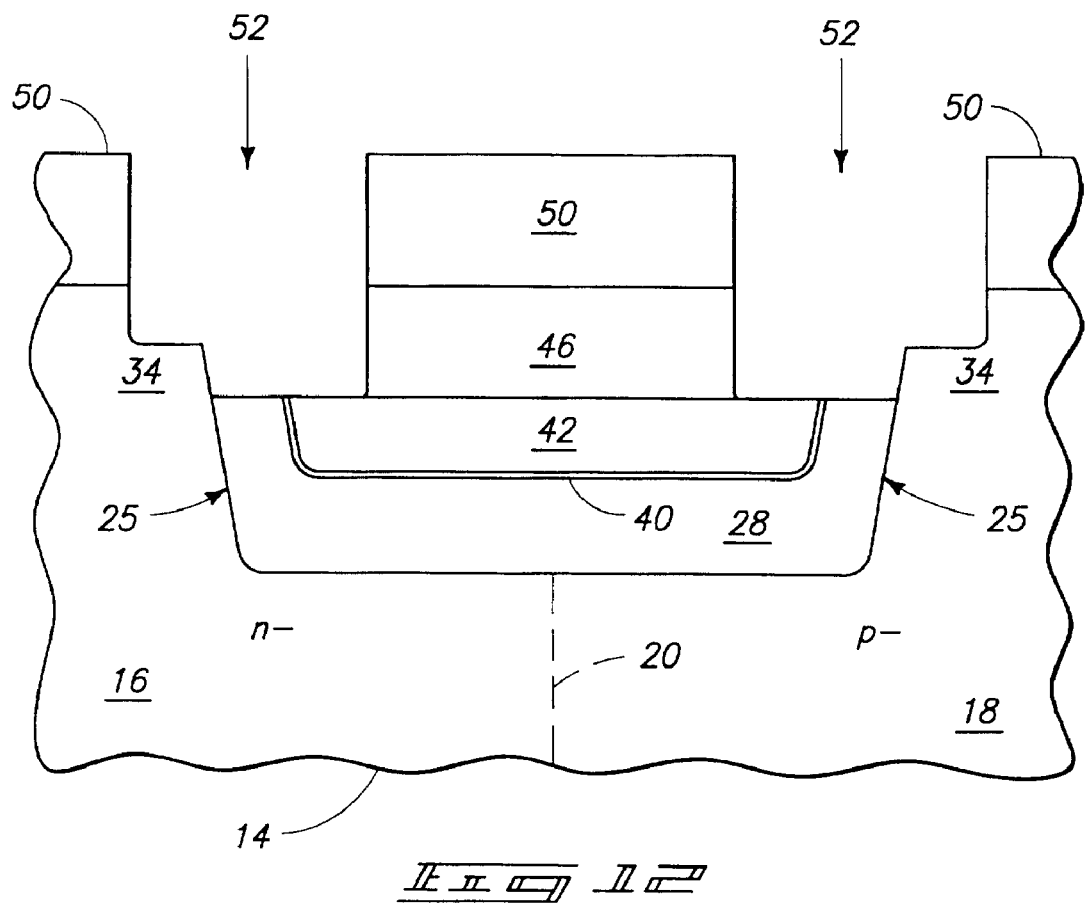
_FIG. 12_

US 7,081,398 B2

METHODS OF FORMING A CONDUCTIVE LINE

TECHNICAL FIELD

This invention relates to methods of forming conductive lines, and to integrated circuitry.

BACKGROUND OF THE INVENTION

The reduction in memory cell and other circuit size implemented in high density dynamic random access memories (DRAMs), static random access memories (SRAMs), logic and other circuitry is a continuing goal in semiconductor fabrication. Implementing electric circuits involves connecting isolated devices through specific electric paths. When fabricating silicon and other semiconductive materials into integrated circuits, conductor devices built into semiconductive substrates need to be isolated from one another. Such isolation typically occurs in the form of LOCOS grown field oxide, and more recently in isolation trench and refill field isolation regions.

Conductive lines, for example transistor gate lines, are formed over substrates. Some lines run globally over large areas of the substrate. Others are much shorter and associated with very small portions of the integrated circuitry. This invention was principally motivated in making processing and structural improvements involving local interconnects.

SUMMARY

The invention includes methods of forming conductive lines, and integrated circuitry. In but one implementation, a method of forming a local interconnect includes forming an isolation trench within a semiconductor substrate. A first trench isolation material is deposited over the semiconductor substrate and to within the isolation trench. First trench isolation material is removed effective to form a line trench within the isolation material into a desired local interconnect configuration. Conductive material is formed within the line trench. A second trench isolation material is deposited over the first trench isolation material, over the conductive material within the isolation trench and within the line trench. At least some first and second trench isolation material is removed from the substrate in at least one common removing step.

In one implementation, a method of forming a local interconnect includes providing a bulk semiconductor substrate having a first conductivity type background region, an adjacent second conductivity type background region and a boundary extending therebetween. An isolation trench is formed within the bulk semiconductor substrate over and along the boundary. A trench isolation material is deposited over the bulk semiconductor substrate and to within the isolation trench. Trench isolation is removed effective to form a line trench within the isolation material into a desired local interconnect configuration. Conductive material is formed to within the line trench.

In one implementation, integrated circuitry includes a semiconductor substrate comprising trench isolation material. A local interconnect line is received within a trench formed within the trench isolation material. The local interconnect line includes at least two different conductive materials. One of the conductive materials lines the trench. Another of the conductive materials is received within a conductive trench formed by the one.

Other implementations and aspects are contemplated.

BRIEF DESCRIPTION OF THE DRAWINGS

Preferred embodiments of the invention are described below with reference to the following accompanying drawings.

FIG. 5 is a view of the FIG. 4 wafer fragment at a processing step subsequent to that shown by FIG. 4.

FIG. 6 is a top plan view of a larger portion of the wafer fragment in process, the above fragmentary views being taken through line X—X in FIG. 6.

FIG. 11 is a top plan view like FIG. 6, but shown at a processing step subsequent to that of FIGS. 6 and 10.

FIG. 12 is a view of a portion of the FIG. 11 wafer fragment as taken through line 12—12 in FIG. 11.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
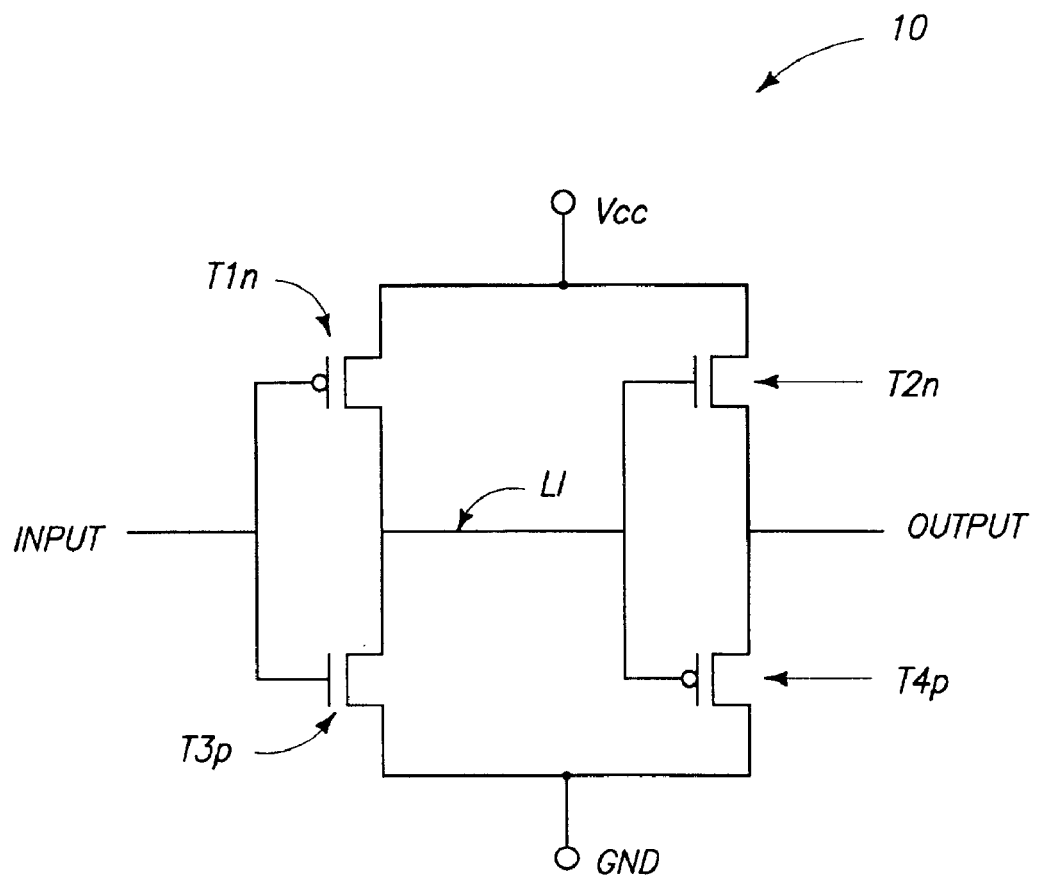
FIG. 1 is a schematic of exemplary integrated circuitry.

The invention contemplates methods of forming local interconnects, and any integrated circuitry involving a local interconnect line, in accordance with the literal wording of the claims. The invention is described with respect to but one exemplary integrated circuit shown in FIG. 1. Such depicts a cross-coupled inverter circuitry 10 comprising n-type transistors T1n and T2n, and p-type transistors T3p and T4p. A local interconnect LI interconnects the gates of T2n and T4p with source/drain regions of T1n and T3p.

Figure 2:
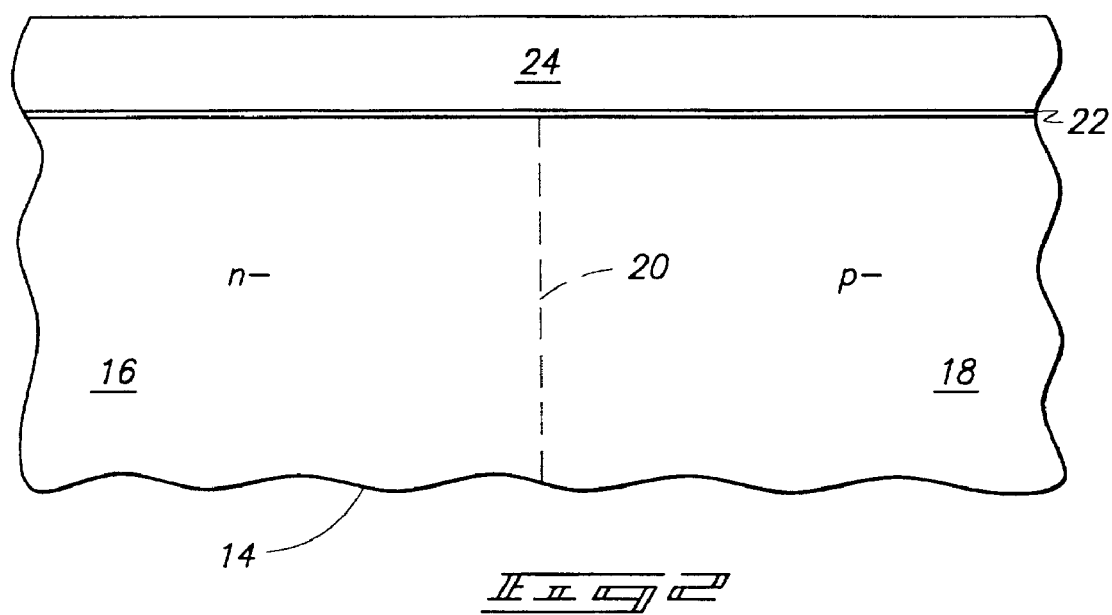
FIG. 2 is a diagrammatic sectional view of a semiconductor wafer fragment in process in accordance with an aspect of the invention.

Referring to FIG. 2, a semiconductor wafer fragment is indicated generally with reference 12. Such comprises a bulk semiconductor substrate having a first conductivity-type background region 16 adjacent a second conductivity-type background region 18, and a boundary 20 extending therebetween. An exemplary preferred material for bulk substrate 14 is monocrystalline, for example monocrystalline silicon, with region 16 being shown lightly background doped with "n" type impurity and region 18 being lightly background doped with "p" type impurity. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the terms "layer" and "material" encompass both the singular and the plural unless otherwise indicated. A pad oxide layer 22 is formed over bulk substrate 14. An exemplary thickness is 100 Angstroms. A masking layer 24 is formed over layer 22. An exemplary material is silicon nitride deposited to an exemplary thickness of 900 Angstroms.

Figure 3:
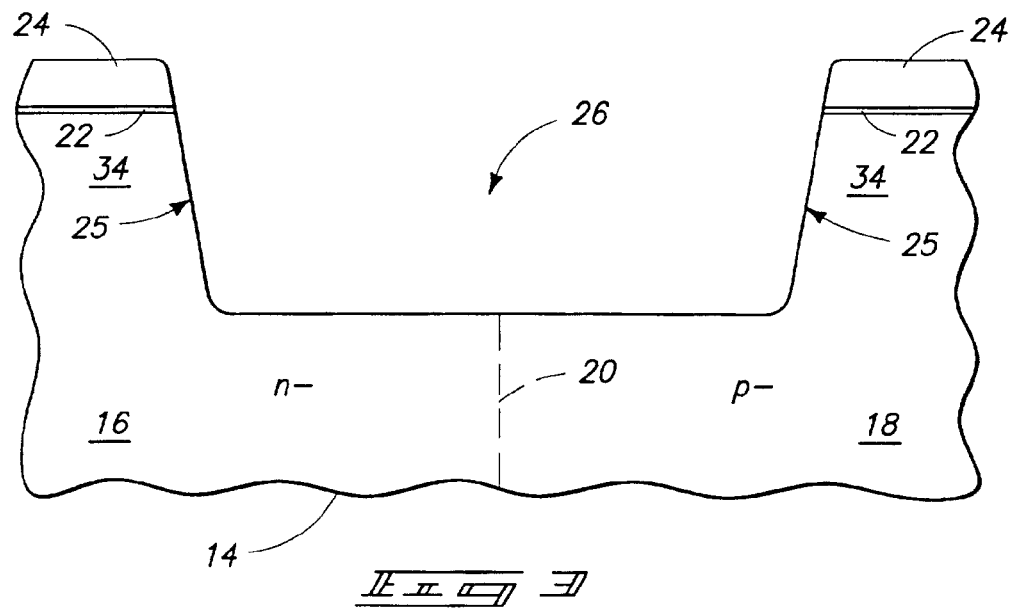
FIG. 3 is a view of the FIG. 2 wafer fragment at a processing step subsequent to that shown by FIG. 2.

Referring to FIG. 3, an isolation trench 26 is formed within bulk semiconductor substrate material 14, which is laterally centered and extends along p-type/n-type boundary 20. Such will be utilized to form interwell isolation, with an exemplary open width of depicted trench 26 being about 0.5 micron. An exemplary depth within substrate material 14 is 3000 Angstroms. Such provides but one example of forming an isolation trench within a semiconductor substrate. Further in the depicted and preferred embodiment, the isolation trench is formed in bulk substrate material, although the invention is in no way so limited. For purposes of the continuing discussion, isolation trench 26 can be considered as having opposing longitudinal sidewalls 25 in the depicted cross-section. Further in the depicted embodiment, isolation trench 26 is formed to be laterally centered over boundary 20.

Figure 4:
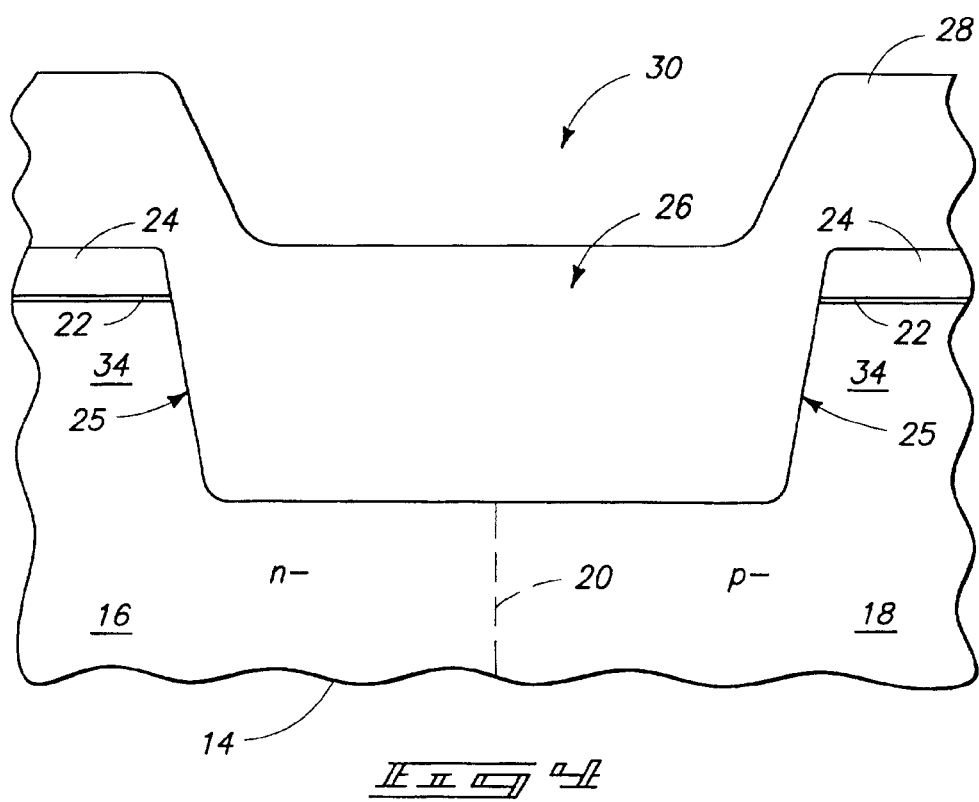
FIG. 4 is a view of the FIG. 3 wafer fragment at a processing step subsequent to that shown by FIG. 3.

Referring to FIG. 4, a first trench isolation material 28 is deposited over substrate 14 and within isolation trench 26. A preferred method of forming layer 28 is by high density plasma chemical vapor deposition. Sidewalls 25 of trench 26 are preferably thermally oxidized (not shown) before or after deposition of material 28.

Referring to FIGS. 5 and 6, exemplary active areas 34 can be seen. First trench isolation material 28 is removed effective to form a line trench 30 within the isolation material into a desired local interconnect configuration. Such removing preferably comprises photolithography and chemical etching, and forms at least a portion of line trench 30 to be laterally centered within isolation trench 26 between sidewalls 25, and laterally centered over boundary 20. In the preferred embodiment, FIG. 6 depicts that line trench 30 includes extensions 32 which do not extend to an edge of the trench isolation material proximate active area substrate material/regions 34. Accordingly at this point in the process in the preferred embodiment, local interconnect trench 30 does not extend to connect with the illustrated active areas. FIG. 6 also depicts exemplary transistor gate outlines 36, which would typically not be formed at this point in the preferred embodiment process. Regardless, it can be seen that the far right illustrated edge of local interconnect trench 30 is also spaced from, and therefore does not connect with, the right illustrated transistor gate outline 36, in this preferred embodiment.

Figure 7:
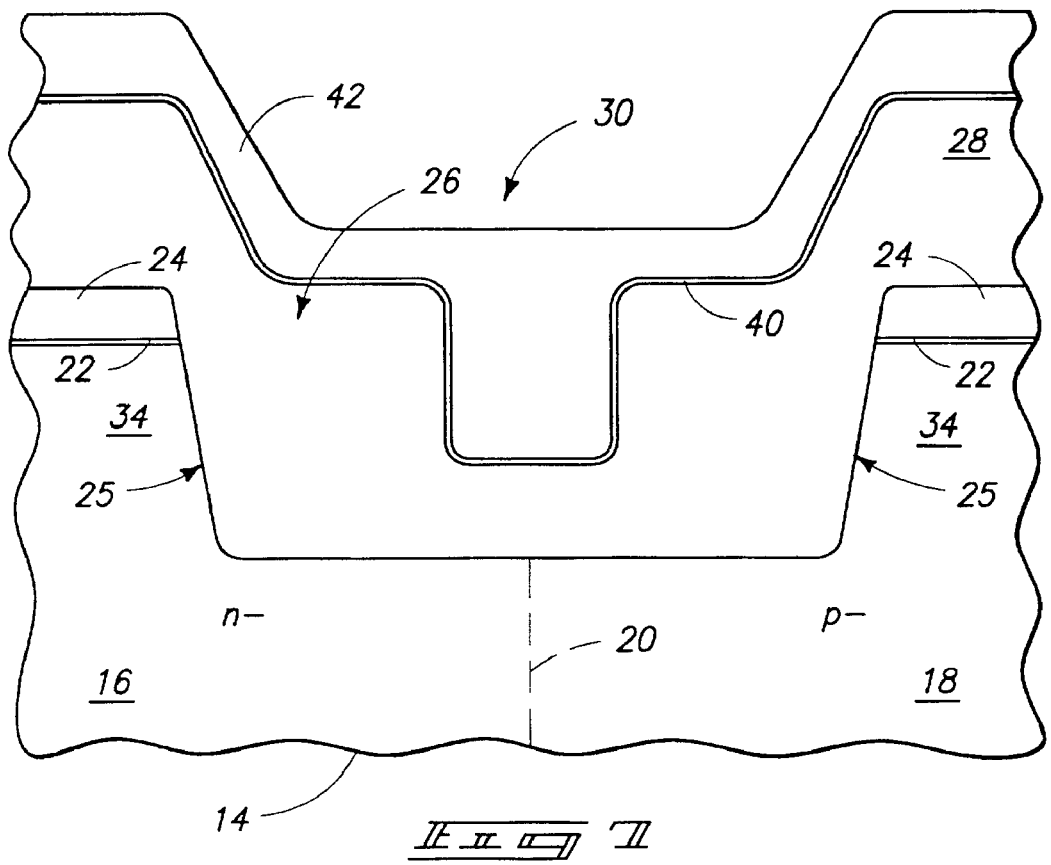
FIG. 7 is a view of the FIG. 5 wafer fragment at a processing step subsequent to that shown by FIG. 5.

Conductive material is formed within trench 30 to form at least a portion of the local interconnect being formed. FIG. 7 illustrates but one exemplary embodiment wherein a first conductive material 40 is formed, preferably by depositing, to within trench 30 to form a conductive lining therewithin. In one preferred embodiment, layer 40 is formed of an oxidation resistant material. Exemplary materials include tungsten silicide and nitrogen-rich titanium nitride. In such preferred embodiment, such thereby forms an oxidation resistant lining within line trench 30. In an alternate considered embodiment, the oxidation resistant liner material might be insulative as opposed to conductive. An exemplary insulative oxidation resistant liner material is silicon nitride. A second conductive material 42, different from first conductive material 40, is deposited to within line trench 30 on (in contact with) conductive lining 40. Exemplary materials for layer 42 include tungsten and doped polysilicon. Of course, a single conductive material could be utilized or more than two conductive materials utilized.

Figure 8:
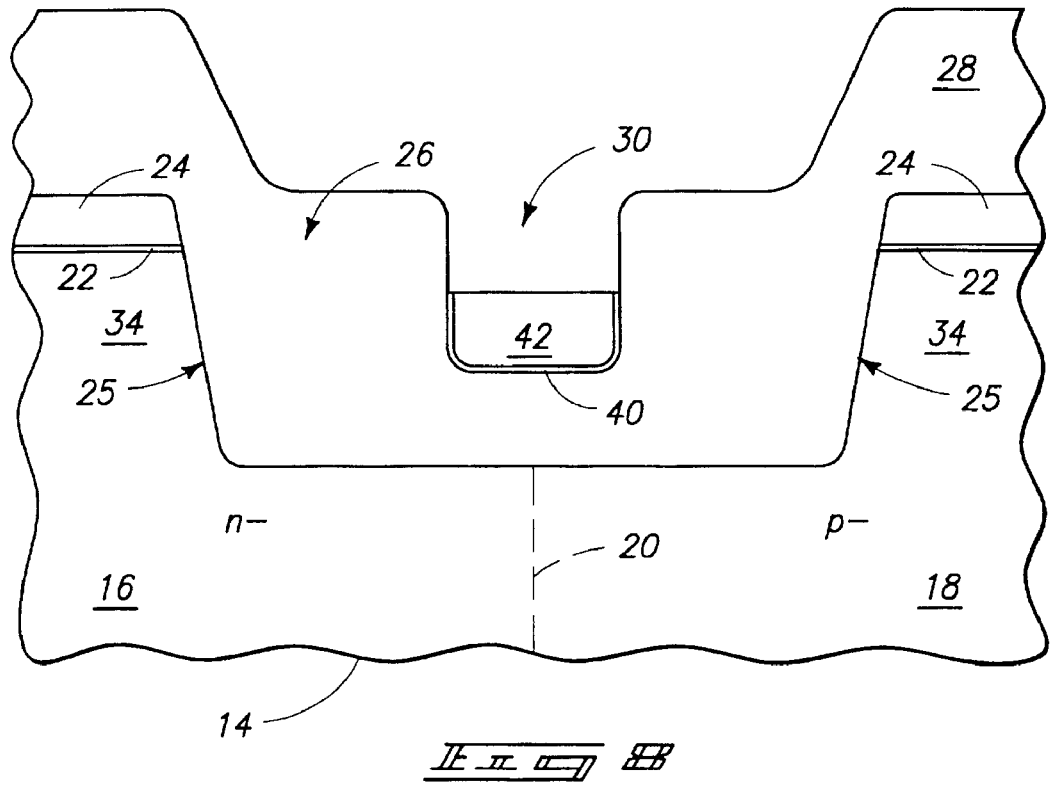
FIG. 8 is a view of the FIG. 7 wafer fragment at a processing step subsequent to that shown by FIG. 7.

Referring to FIG. 8, conductive materials 40/42 are recessed within line trench 30 after their deposition. An exemplary preferred process for doing so would be one or more suitable timed chemical etching(s). Such provides but a few preferred examples of forming conductive materials to within line trench 30.

Figure 9:
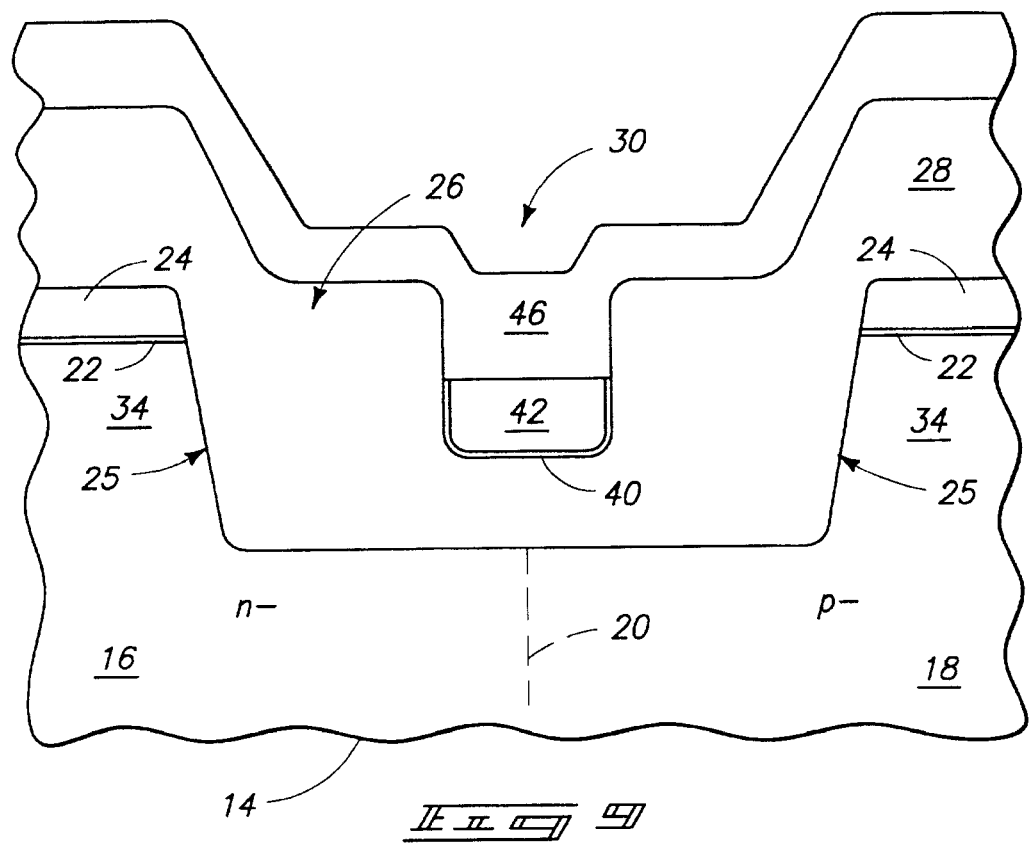
FIG. 9 is a view of the FIG. 8 wafer fragment at a processing step subsequent to that shown by FIG. 8.

Referring to FIG. 9, a second trench isolation material 46 is deposited over first trench isolation material 28, over recessed conductive material 40/42 within isolation trench 26, and within line trench 30. Second trench isolation material 46 might be the same composition as first trench isolation material 28, or be of different composition. More preferably, such are the same material, with high density plasma deposited oxide being the preferred example. In the illustrated and preferred embodiment, second trench isolation material 46 is formed on (in contact with) conductive materials 40/42.

Figure 10:
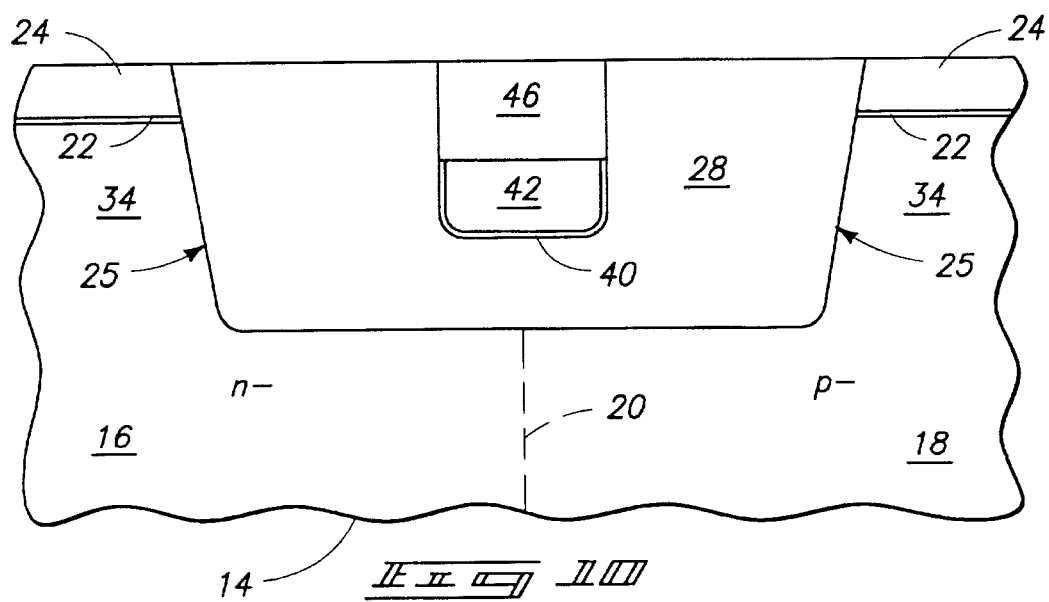
FIG. 10 is a view of the FIG. 9 wafer fragment at a processing step subsequent to that shown by FIG. 9.

Referring to FIG. 10, at least some first trench isolation material 28 and at least some second trench isolation material 46 are removed from the substrate in at least one common removing step. A preferred process includes chemical mechanical polishing (CMP). In the depicted preferred embodiment, such polishing is shown conducted effective to substantially stop on nitride masking layer 24. Of course, polishing could also be continued to remove more material, for example polishing through nitride layer 24 and pad oxide layer 22. Further by way of example only, nitride layer 24 and pad oxide layer 22 might be selectively chemically etched in processing subsequent to that depicted by FIG. 10.

Referring to FIGS. 11 and 12, an insulative material 50 is formed over trench isolation material 28/46 and over conductive material 40/42. Exemplary materials for layer 50 include undoped and doped oxides, for example borophosphosilicate glass, phosphosilicate glass, and other doped and undoped silicon dioxides. Further at this point in the process, gate lines 36 have been fabricated prior to deposition of layer 50, and layers 24 and 22 have been removed. Contact openings 52 are etched into insulative material 46 and 50 to bridge over and between active area substrate material 34 and conductive material 40/42 within line trench 30.

Figure 13:
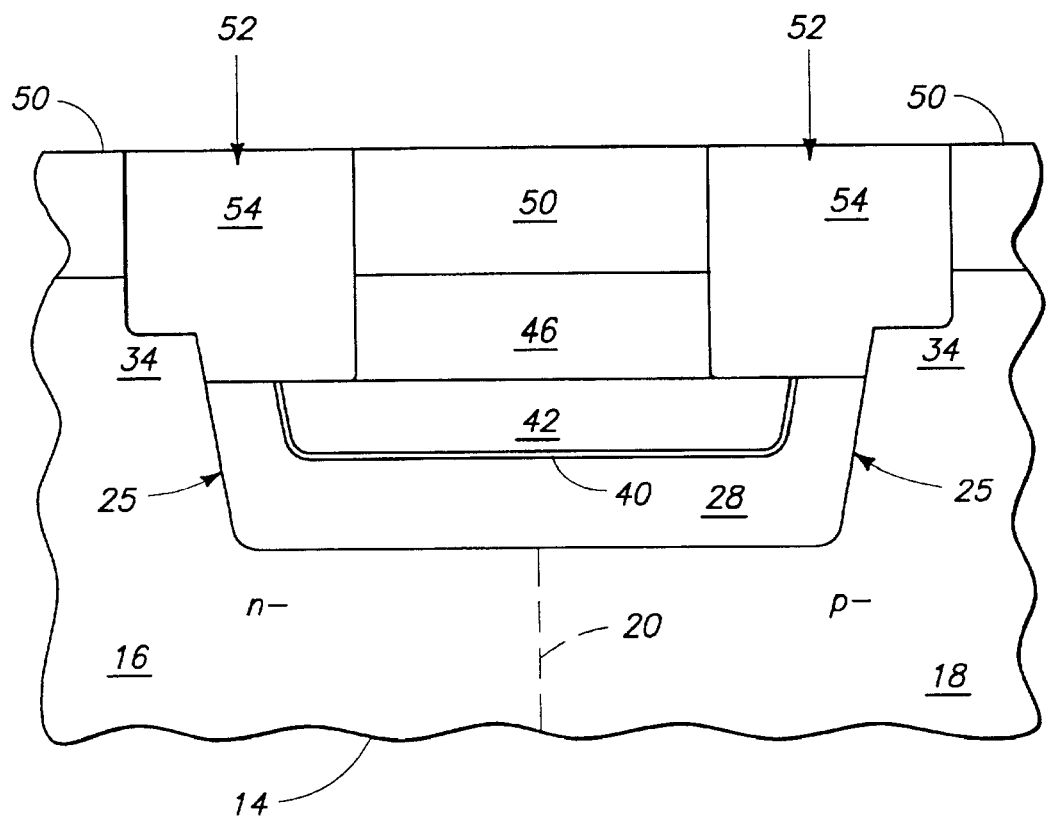
FIG. 13 is a view of the FIG. 12 wafer fragment at a processing step subsequent to that shown by FIG. 12.

Referring to FIG. 13, a conductor is formed within contact openings 52 which electrically connects the conductive material with the active area substrate material, and with the far right illustrated gate 52 as shown in FIG. 6. Such thereby effectively extends the conductive local interconnect line to electrically connect with the depicted source/drain regions and transistor gate line.

The invention also contemplates integrated circuitry comprising a local interconnect line independent of any method of fabrication.

The invention may have particular application in the formation of local interconnects in the periphery of SRAM circuitry. Processing and circuitry in accordance with the invention can serve to provide an extra level of interconnect, thereby freeing up space for higher level interconnects at upper levels of the fabrication. By embedding an extra level of interconnect in trench isolation areas, tighter metallization and interconnect density might be achievable.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a local interconnect, comprising:
   providing a bulk semiconductor substrate having a first conductivity type background region, an adjacent second conductivity type background region and a boundary extending therebetween;
   forming an isolation trench within the bulk semiconductor substrate laterally centered over and along the boundary;
   depositing a first trench isolation material over the bulk semiconductor substrate and to within the isolation trench;
   chemically etching the first trench isolation material effective to form a line trench within the first trench isolation material at least a portion of which is laterally centered within the isolation trench and laterally centered over the boundary;
   depositing conductive material within the line trench and recessing it within the line trench after depositing it;
   depositing a second trench isolation material the same as the first trench isolation material over the first trench isolation material, over the recessed conductive material within the isolation trench and within the line trench; and
   removing at least some first and second trench isolation material from the semiconductor substrate in at least one common removing step.

2. The method of claim 1 wherein the at least one common removing step comprises CMP.

3. The method of claim 1 wherein the depositing conductive material within the line trench comprises depositing at least two different composition conductive materials to within the line trench.

4. The method of claim 1 wherein the line trench in the first trench isolation material does not have a width which extends to active area substrate material in at least one cross section, and further comprising after the removing:
   forming insulative material over the first and second trench isolation materials and over the conductive material;
   etching a contact opening into the insulative material which bridges over and between said active area substrate material and said conductive material; and
   forming a conductor within the contact opening which electrically connects said conductive material with said active area substrate material.

5. A method of forming a local interconnect, comprising:
   forming an isolation trench within a semiconductor substrate;
   depositing a first trench isolation material over the semiconductor substrate and to within the isolation trench;
   removing first trench isolation material effective to form a line trench within the first trench isolation material into a desired local interconnect configuration;
   forming conductive material within the line trench;
   depositing a second trench isolation material over the first trench isolation material, over the conductive material within the isolation trench and within the line trench; and
   removing at least some first and second trench isolation material from the semiconductor substrate in at least one common removing step.

6. The method of claim 5 wherein the semiconductor substrate comprises a bulk monocrystalline substrate, and the isolation trench is formed in bulk monocrystalline substrate material.

7. The method of claim 5 wherein the first and second trench isolation materials are the same in composition.

8. The method of claim 5 wherein the first and second trench isolation materials are different in composition.

9. The method of claim 5 wherein the removing of the first trench isolation material to form the line trench comprises chemical etching.

10. The method of claim 5 wherein the at least one common removing step comprises CMP.

11. The method of claim 5 wherein the forming conductive material within the line trench comprises depositing conductive material and recessing it within the line trench after the depositing.

12. The method of claim 5 wherein the forming conductive material within the line trench comprises depositing at least two different composition conductive materials to within the line trench.

13. A method of forming a local interconnect, comprising:
   forming an isolation trench within semiconductive material of a semiconductor substrate, the semiconductive material having an outer surface;
   depositing a trench isolation material over the semiconductor substrate and to within the isolation trench;
   removing trench isolation material from within the isolation trench effective to form a line trench within the trench isolation material into a desired local interconnect configuration, the line trench having a base which is lower than the outer surface;
   forming an oxidation resistant liner material to within the line trench to form an oxidation resistant lining within the line trench; and
   depositing conductive material to within the line trench on the oxidation resistant lining.

14. The method of claim 13 wherein the oxidation resistant liner material is insulative.

15. The method of claim 13 wherein the oxidation resistant liner material is conductive.

16. The method of claim 13 wherein the removing forms at least a portion of the line trench to be laterally centered between sidewalls of the isolation trench in at least one cross section.

17. The method of claim 13 comprising covering the conductive material with insulative material the same as the trench isolation material.

18. The method of claim 17 wherein at least some of the insulative material is received within the line trench and on the conductive material.

19. A method of forming a local interconnect, comprising:
   forming an isolation trench within semiconductive material of a semiconductor substrate, the semiconductive material having an outer surface, the isolation trench having opposing longitudinal sidewalls in at least one cross section;
   depositing a trench isolation material over the semiconductor substrate and to within the isolation trench;
   removing trench isolation material from within the isolation trench effective to form a line trench within the trench isolation material into a desired local interconnect configuration which is laterally centered between the opposing isolation trench sidewalls in the one cross section, the line trench having a base which is lower than the outer surface;

forming conductive material to within the line trench; and after forming the conductive material, forming insulative material within the line trench below the outer surface.

20. The method of claim 19 wherein the forming conductive material within the line trench comprises depositing conductive material and recessing it within the line trench after the depositing.

21. The method of claim 19 wherein the forming conductive material within the line trench comprises depositing at least two different composition conductive materials to within the line trench.

22. The method of claim 19 wherein the semiconductor substrate comprises a bulk monocrystalline substrate, and the isolation trench is formed in bulk monocrystalline substrate material.

23. A method of forming a local interconnect, comprising:

providing a bulk semiconductor substrate having a first conductivity type background region, an adjacent second conductivity type background region and a boundary extending therebetween, the bulk semiconductor substrate having an outer surface;

forming an isolation trench within semiconductive material of the bulk semiconductor substrate over and along the boundary;

depositing a trench isolation material over the bulk semiconductor substrate and to within the isolation trench effective to over fill the isolation trench;

removing trench isolation material from within the isolation trench effective to form a line trench within the trench isolation material into a desired local interconnect configuration, the line trench having a base which is lower than the outer surface;

forming conductive material to within the line trench; and after forming the conductive material, forming insulative material within the line trench below the outer surface.

24. The method of claim 23 comprising forming the isolation trench to be laterally centered over the boundary.

25. The method of claim 23 comprising forming the line trench to be laterally centered over the boundary.

26. The method of claim 23 comprising forming the isolation trench and the line trench to be laterally centered over the boundary.

27. The method of claim 23 comprising forming the line trench to be laterally centered between longitudinal sidewalls of the isolation trench in at least one cross section.

28. A method of forming a local interconnect comprising:

overfilling an isolation trench formed relative to an outer surface of semiconductive material of a semiconductor substrate with trench isolation material;

etching trench isolation material from within the isolation trench elevationally lower than the outer surface effective to form a line trench into a desired local interconnect line configuration within the trench isolation material, the line trench in the trench isolation material not having a width which extends to active area substrate material in at least one cross section, the line trench etched into the trench isolation material having an insulative base which is lower than the outer surface of the semiconductive material; and forming conductive material over the semiconductor substrate which at least partially fills the trench.

29. The method of claim 28 wherein the semiconductor substrate comprises a bulk monocrystalline substrate, and the isolation trench is formed in bulk monocrystalline substrate material.

30. The method of claim 28 wherein the forming conductive material within the line trench comprises depositing conductive material and recessing it within the line trench after the depositing.

31. The method of claim 28 wherein the forming conductive material within the line trench comprises depositing at least two different composition conductive materials to within the line trench.

32. A method of forming a local interconnect comprising:

etching a line trench into a desired line configuration within trench isolation material formed relative to an outer surface of semiconductive material of a semiconductor substrate, the line trench in the trench isolation material not having a width which extends to active area substrate material in at least one cross section, the line trench having an insulative base which is lower than the outer surface;

forming conductive material over the semiconductor substrate which at least partially fills the line trench;

forming insulative material over the trench isolation material and over the conductive material and to within the isolation trench;

etching a contact opening into the insulative material which bridges over and between said active area substrate material and said conductive material; and forming a conductor within the contact opening which electrically connects said conductive material with said active area substrate material.

33. The method of claim 32 wherein the forming conductive material within the line trench comprises depositing conductive material and recessing it within the line trench after the depositing.

34. The method of claim 32 wherein the forming conductive material within the line trench comprises depositing at least two different composition conductive materials to within the line trench.

35. The method of claim 32 wherein the semiconductor substrate comprises a bulk monocrystalline substrate, and the isolation trench is formed in bulk monocrystalline substrate material.

36. The method of claim 13 wherein the depositing is effective to overfill the line trench.

37. The method of claim 19 wherein the depositing is effective to overfill the line trench.

38. The method of claim 23 wherein the depositing is effective to overfill the line trench.

39. The method of claim 28 wherein the line trench formed in the trench isolation material does not have a width which extends to active area substrate material in any cross section.

* * * * *